(12) United States Patent
Ujihara et al.

(10) Patent No.: US 10,151,046 B2
(45) Date of Patent: Dec. 11, 2018

(54) METHOD FOR PRODUCING CRYSTAL OF SILICON CARBIDE, AND CRYSTAL PRODUCTION DEVICE

(71) Applicants: National University Corporation Nagoya University, Nagoya-shi, Aichi (JP); Central Glass Co., Ltd., Ube-shi, Yamaguchi (JP)

(72) Inventors: Toru Ujihara, Nagoya (JP); Shunta Harada, Nagoya (JP); Daiki Koike, Nagoya (JP); Tomonori Umezaki, Ube (JP)

(73) Assignees: National University Corporation Nagoya University, Nagoya-shi (JP); Central Glass Co., Ltd., Ube-shi (JP)

( * ) Notice: Subject to any disclaimer, the term of this patent is extended or adjusted under 35 U.S.C. 154(b) by 0 days.

(21) Appl. No.: 15/510,038

(22) PCT Filed: Sep. 10, 2015

(86) PCT No.: PCT/JP2015/075711
§ 371 (c)(1),
(2) Date: Mar. 9, 2017

(87) PCT Pub. No.: WO2016/039415
PCT Pub. Date: Mar. 17, 2016

(65) Prior Publication Data
US 2017/0260647 A1    Sep. 14, 2017

(30) Foreign Application Priority Data
Sep. 11, 2014    (JP) .................................. 2014-184978

(51) Int. Cl.
C30B 19/10    (2006.01)
C30B 19/12    (2006.01)
(Continued)

(52) U.S. Cl.
CPC ............ *C30B 19/10* (2013.01); *C30B 19/062* (2013.01); *C30B 19/068* (2013.01); *C30B 19/12* (2013.01);
(Continued)

(58) Field of Classification Search
CPC ......... C30B 29/36; C30B 19/04; C30B 19/12; C30B 15/30; C30B 9/06; C23C 14/0635;
(Continued)

(56) References Cited

U.S. PATENT DOCUMENTS 3,228,753 A * 1/1966 Larsen ................. C30B 15/005
117/216
3,353,914 A * 11/1967 Pickar, Jr. .............. C30B 15/00
423/345

(Continued)

FOREIGN PATENT DOCUMENTS

JP    H 11171689 A    6/1999
JP    2008-100854 A    5/2008
(Continued)

OTHER PUBLICATIONS

International Search Report (PCT/ISA/210) issued in PCT Application No. PCT/JP2015/075711 dated Nov. 2, 2015 with English translation (4 pages).
(Continued)

*Primary Examiner* — Matthew J Song
(74) *Attorney, Agent, or Firm* — Crowell & Moring LLP

(57) ABSTRACT

Provided is a method that allows growing a single crystal of silicon carbide on an off-substrate of silicon carbide while suppressing surface roughening. The method for producing a crystal of silicon carbide includes rotating a seed crystal of silicon carbide while bringing the seed crystal into contact with a starting material solution containing silicon and carbon. A crystal growth surface of the seed crystal has an
(Continued)

off-angle, and the position of a rotation center of the seed crystal lies downstream of the central position of the seed crystal in a step flow direction that is a formation direction of the off-angle.

9 Claims, 6 Drawing Sheets

(51) Int. Cl.
    *C30B 29/36*      (2006.01)
    *C30B 19/06*      (2006.01)
    *C23C 14/06*      (2006.01)
    *H01L 21/02*      (2006.01)
    *C30B 9/06*      (2006.01)
    *C30B 15/30*      (2006.01)

(52) U.S. Cl.
CPC .......... *C30B 29/36* (2013.01); *C23C 14/0635* (2013.01); *C30B 9/06* (2013.01); *C30B 15/30* (2013.01); *H01L 21/02378* (2013.01); *H01L 21/02433* (2013.01)

(58) Field of Classification Search
CPC ............. C23C 16/325; H01L 21/02378; H01L 21/02433
See application file for complete search history.

(56) References Cited

U.S. PATENT DOCUMENTS

| | | | | |
|---|---|---|---|---|
| 2011/0315073 | A1* | 12/2011 | Sakamoto | C30B 9/06 117/28 |
| 2012/0280254 | A1* | 11/2012 | Muto | C30B 25/186 257/77 |
| 2015/0167197 | A1* | 6/2015 | Ujihara | C30B 17/00 423/345 |
| 2015/0225872 | A1* | 8/2015 | Kamei | C30B 19/067 117/60 |
| 2017/0067183 | A1* | 3/2017 | Seki | C30B 9/12 |

FOREIGN PATENT DOCUMENTS

| | | |
|---|---|---|
| JP | 2013-173645 A | 9/2013 |
| JP | 2014 043365 A | 3/2014 |
| JP | 2014-43367 A | 3/2014 |
| WO | WO 2014/034081 A1 | 3/2014 |

OTHER PUBLICATIONS

Japanese-language Written Opinion (PCT/ISA/237) issued in PCT Application No. PCT/JP2015/075711 dated Nov. 2, 2015 (4 pages).
Yamamoto et al., "Low-Dislocation-Density 4H—SiC Crystal Growth Utilizing Dislocation Conversion during Solution Method," Applied Physics Express 7, 065501, May 2, 2014, pp. 065501-1-065501-3.
Mitani et al., "Growth Rate and Surface Morphology of 4H—SiC Crystals Grown from Si—Cr—C and Si—Cr—Al—C solutions Under Various Temperature Gradient Conditions", Journal of Crystal Growth, vol. 401, 2014, pp. 681-685.
Komatsu et al., "Growth Rate and Surface Morphology of 4H—SiC Single Crystal Grown Under Various Supersaturations Using Si—C Solution," Material Science Forum, vol. 740-742, 2013, pp. 23-26.
Zhu et al., "Influence of Solution Flow on Step Bunching in Solution Growth of SiC Crystals," Crystal Growth and Design, vol. 13, 2013, pp. 3691-3696.
European Search Report issued in counterpart Japanese Application No. 15839771.1-1103 dated Apr. 6, 2018 (six (6) pages).

* cited by examiner

FIG. 4A EXAMPLE 1
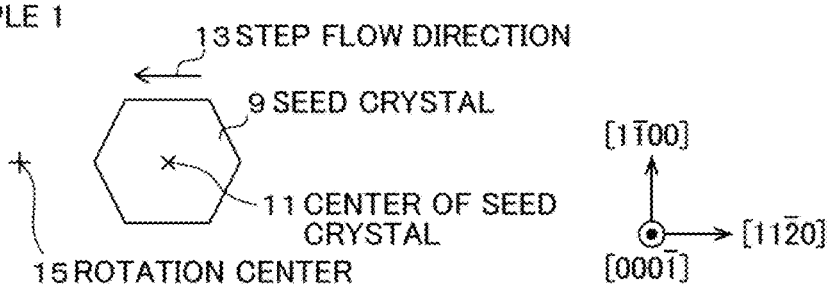
FIG. 4B EXAMPLE 2
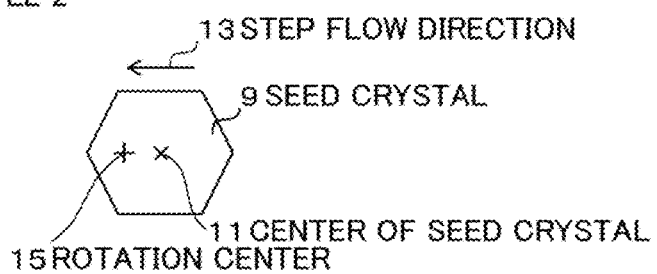
FIG. 4C COMPARATIVE EXAMPLE 1
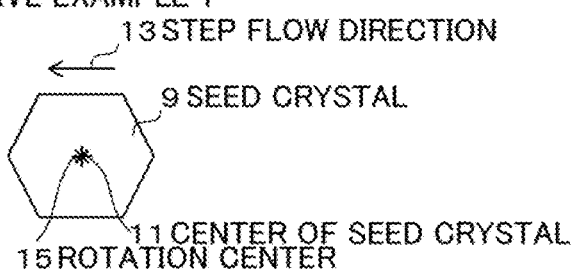
FIG. 4D COMPARATIVE EXAMPLE 2
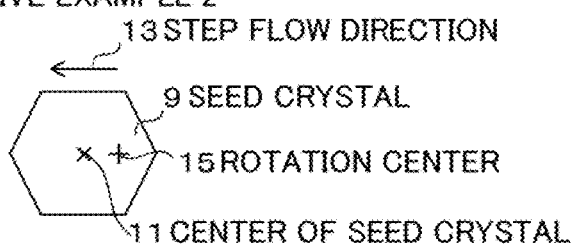
FIG. 4E COMPARATIVE EXAMPLE 3
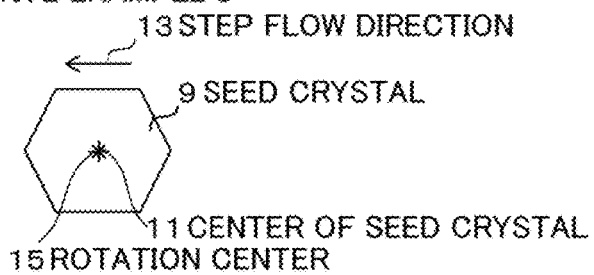

METHOD FOR PRODUCING CRYSTAL OF SILICON CARBIDE, AND CRYSTAL PRODUCTION DEVICE

TECHNICAL FIELD

The present invention relates, for instance, to a method for producing a crystal of silicon carbide in accordance with a so-called liquid phase growth method.

BACKGROUND ART

Silicon carbide (SiC) has a band gap that is about 2 to 3 times that of Si, which is widely used as a material for electronic devices and the like, and has a dielectric breakdown voltage that is about 10 times higher than that of Si. Accordingly, SiC crystals hold promise as a substrate material power devices that surpass devices which silicon is used. Herein SiC substrates are obtained by being cut out of a SiC-single crystal ingot. Known methods for producing SiC ingots include methods (vapor phase growth) in which a SiC crystal is grown in a vapor phase and methods (liquid phase growth) in which a SiC crystal is grown in a liquid phase. As compared with vapor phase growth, liquid phase growth involves growing a crystal in a state close to thermal equilibrium, and hence a high-quality SiC single crystal of low defect density is expected to be obtained as a result.

Desirably, the reliability of SiC should be high, and costs low, in order for SiC to be widely adopted as a substrate material for power devices. It has been reported that enhancement of reliability upon integration into a device is significantly affected by dislocation defects in SiC single crystals. There is thus a demand for production technologies of high-quality SiC single crystals having few dislocation defects. In terms of reducing production costs, meanwhile, technical studies aimed at achieving larger crystal sizes are being conducted in order to secure the number of chips are cut out of a SiC single-crystal ingot (wafer).

Crystal growth techniques are thus required that allow both improving the quality and increasing the size of SiC single crystals, in terms of promoting the adoption of SiC power devices.

As regards improving the quality of SiC single crystals, it has been reported that when crystal growth is performed on a seed crystal substrate having an off-angle (hereafter, referred to as off-substrate) in accordance with a liquid phase growth method, threading screw dislocations and/or threading edge dislocations extending parallelly to the growth direction are converted to defects in the basal plane, and accordingly growth-derived defects are swept outside the crystal, as a result of which dislocation density in the grown crystal can be dramatically reduced (PTL 1 and NPL 1).

On the other hand, issues that arise when the size of SiC single crystals is increased include for instance the occurrence of surface roughening at the growth interface during crystal growth. Surface roughening is extremely difficult to repair once the former has occurred during crystal growth, and accordingly further crystal growth becomes virtually impossible. The phenomenon of surface roughening is particularly noticeable during crystal growth on off-substrates. Therefore, it has been proposed to add an additive component to the growth atmosphere, or to reduce the temperature gradient in the vicinity of the growth interface, or to control solvent flow, in order to prevent surface roughening (NPL 2, 3 and 4).

CITATION LIST

Patent Literature

[PTL 1] WO 2014/034081

Non Patent Literature

[NPL 1] Y. Yamamoto, S. Harada, K. Seki, A. Horio, T. Mitsuhashi, T. Ujihara, APEX 7 065501 (2014)

[NPL 2] T. Mitani, N. Komatsu, T. Takahashi, T. Kato, K. Fujii, Ujihara, Y. Matsumoto, K. Kurashige, H. Okumura, J. Cryst. Growth 681-685 401 (2014)

[NPL 3] N. Komatsu, T. Mitani, T. Takahashi, M, Okamura, T. Kato, H. Okumura, Mat. Sci. Forum 740-742 23-26 (2013)

[NPL 4] C. Zhu, S. Harada, K. Seki, H. Zhang, H. Niinomi, M. Tagawa, T. Ujihara, Cryst. Growth Des. 13 3691 (2013)

SUMMARY OF INVENTION

As described above, a desire exists for the development of crystal growth technologies in which surface roughening does not occur during crystal growth on an off-substrate, in order to combine better quality with larger diameters in SiC single crystals. However, the shape of the growth interface becomes unstable curing crystal growth on an off-substrate, and depressions called trenches become formed in parts of the crystal as crystal growth progresses. This is problematic in that, as a result, surface roughening becomes likelier to occur during crystal growth on an off-substrate than on an on-substrate crystal substrate having no off-angle). On-substrates are used in NPL 2 and NPL 3. In the growth of SiC bulk single crystals, there is currently no choice but to utilize on-substrates as seed crystals. High-quality large crystals can be expected to become feasible if a technology is realized in which surface roughening does not occur during crystal growth on an off-substrate.

It is an object of the present invention to provide a method for growing a crystal of silicon carbide that allows suppressing surface roughening during crystal growth on an off-substrate.

Solution to Problem

The inventors focused on the formation of trenches on crystal surfaces, as a cause of surface roughening. Supply of carbon from the solvent becomes disrupted at trench portions, and hence it is very difficult to repair surface roughening once a trench has occurred during crystal growth. The inventors found that formation of trenches during crystal growth on an off-substrate can be suppressed, also when using the off-substrate as a seed crystal, by prescribing the flow direction of solvent to run against a step flow direction of the off-substrate.

A first invention of the present application is a method for producing a crystal of silicon carbide, the method including rotating a seed crystal of silicon carbide while bringing the seed crystal into contact with a starting material solution containing silicon and carbon, wherein a crystal growth surface of the seed crystal has an off-angle, the position of a rotation center of the seed crystal lies downstream of the central position of the seed crystal in a step flow direction that is a formation direction of the off-angle, and rotation of the seed crystal includes periodic repeating of forward rotation and reverse rotation.

Preferably, the rotation center of the seed crystal is present inside or outside the seed crystal, and more preferably, rotation of the seed crystal is carried out within a plane parallel to the liquid surface of the starting material solution. Further, it is preferable that the starting material solution contains chromium, and the proportion of chromium is 20 mol % to 60 mol %, for instance 30 mol % to 50 mol %, and for instance 35 mol % to 45 mol %, with respect to 100 mol % as the total of silicon and chromium.

A second invention of the present application is a method for producing a crystal of silicon carbide, the method including bringing a seed crystal of silicon carbide into contact with a starting material solution containing silicon and carbon and held within a vessel, wherein a crystal growth surface of the seed crystal has an angle, the vessel rotates in such a manner that the position of a rotation center thereof lies downstream of the central position of the seed crystal in a flow direction that a formation direction of the off-angle, and rotation of the vessel includes periodic repeating of forward rotation and reverse rotation.

A third invention of the present application is a crystal production device, including: a starting material solution containing a starting material of a crystal; a vessel that accommodates the starting material solution; a seed crystal having an off-angle on the crystal growth surface; and a rotating unit that rotates the seed crystal while bringing the seed crystal into contact with the starting material solution, wherein the position or a rotation center of the seed crystal lies downstream of the central position of the seed crystal in a step flow direction that is a formation direction of the off-angle, and rotation of the seed crystal includes periodic repeating of forward rotation and reverse rotation.

A fourth invention of the present application is a crystal production device, including: a starting material solution containing a starting material of a crystal; a vessel that accommodates the starting material solution; and a seed crystal having an off-angle on the crystal growth surface, wherein the vessel rotates in such a manner that the position of a rotation center thereof lies downstream of the central position of the seed crystal in a step flow direction that is a formation direction of the off-angle, and rotation of the vessel includes periodic repeating of forward rotation and reverse rotation.

The present invention encompasses the following aspects.

(1) A method for producing a crystal of silicon carbide, the method including rotating a seed crystal of silicon carbide while bringing the seed crystal into contact with a starting material solution containing silicon and carbon, wherein a crystal growth surface of the seed crystal has an off-angle, the position of a rotation center of the seed crystal lies downstream of the central position of the seed crystal in a step flow direction that is a formation direction of the off-angle, and rotation of the seed crystal includes periodic repeating of forward rotation and reverse rotation.

(2) The method for producing a crystal of silicon carbide according to (1), wherein the rotation center of the seed crystal is present within the seed crystal.

(3) The method for producing a crystal of silicon carbide according to (1), wherein the rotation center of the seed crystal is present outside the seed crystal.

(4) The method for producing a crystal of silicon carbide according to any one of (1) to (3), wherein rotation of the seed crystal is carried out within a plane parallel to the liquid surface of the starting material solution.

(5) A method for producing a crystal of silicon carbide, the method including bringing a seed crystal of silicon carbide into contact with a starting material solution containing silicon and carbon and held within a vessel, wherein a crystal growth surface of the seed crystal has an off-angle, the vessel rotates in such a manner that the position of a rotation center thereof lies downstream of the central position of the seed crystal in a step flow direction that is a formation direction of the off-angle, and rotation of the vessel includes periodic repeating of forward rotation and reverse rotation.

(6) The method for producing a crystal of silicon carbide according to (5), wherein the rotation center of the vessel present within the seed crystal.

(7) The method for producing a crystal of silicon carbide according to (5), wherein the rotation center of the vessel is present outside the seed crystal.

(8) The method for producing a crystal of silicon carbide according to any one of (1) to (7), wherein the starting material solution contains chromium, and the proportion of chromium is 20 mol % to 60 mol % with respect to 100 mol % as the total of silicon and chromium.

(9) A crystal production device, including:

a starting material solution containing a starting material of a crystal;

a vessel that accommodates the starting material solution;

a seed crystal having an off-angle on the crystal growth surface; and a rotating unit that rotates the seed crystal while bringing the seed crystal into contact with the starting material solution, wherein the position of a rotation center of the seed crystal lies downstream of the central position of the seed crystal in a step flow direction that is a formation direction of the off-angle, and rotation of the seed crystal includes periodic repeating of forward rotation and reverse rotation.

(10) A crystal production device, including:

a starting material solution containing starting material of a crystal;

a vessel that accommodates the starting material solution; and a seed crystal having an off-angle on the crystal growth surface, wherein the vessel rotates in such a manner that the position of a rotation center thereof lies downstream of the central position of the seed crystal in a step flow direction that is a formation direction of the off-angle, and rotation of the vessel includes periodic repeating of forward rotation and reverse rotation.

A crystal of silicon carbide, which is produced by the method according to any one of (1) to (8).

The present invention succeeds in providing method for growing a crystal of silicon carbide that allows suppressing surface roughening during crystal growth on an off-substrate.

BRIEF DESCRIPTION OF DRAWINGS

FIGS. 4A to 4E are diagrams illustrating the positional relationship between the center 11 of a seed crystal and a rotation center 15 in examples and comparative examples.

DESCRIPTION OF EMBODIMENTS

Embodiments of the present invention will be explained next with reference to accompanying drawings.

Figure 1:
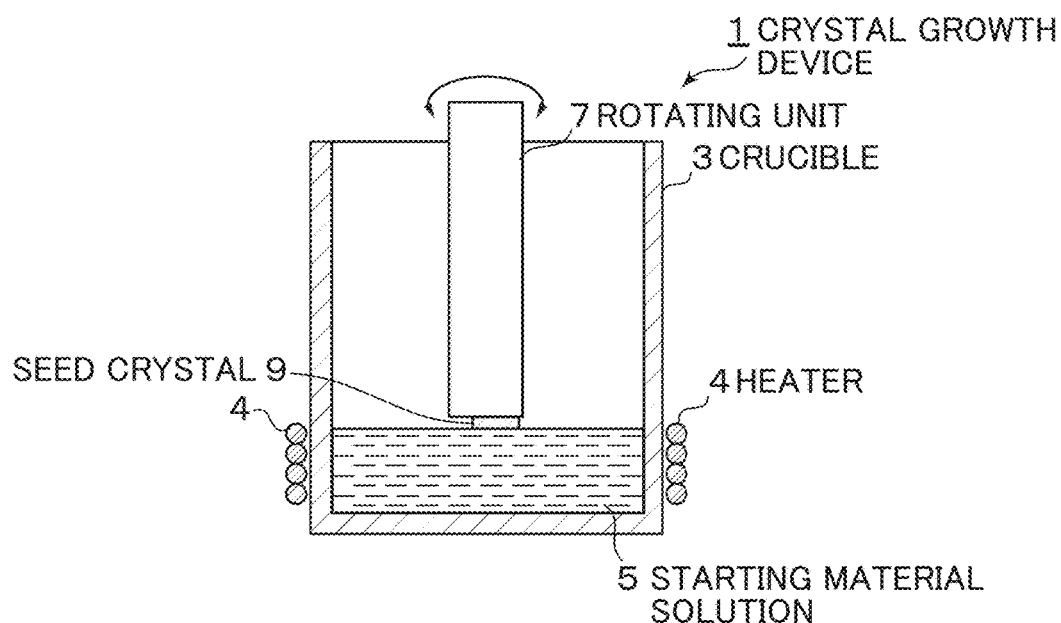
FIG. 1 is a diagram illustrating an overview of a crystal growth device 1 according to the present embodiment.

FIG. 1 is a diagram illustrating an overview of a crystal growth device 1 of the present embodiment. The crystal growth device 1 has a starting material solution 5 containing silicon and carbon, inside a crucible 3, such that a seed crystal 9 attached to the tip of a rotating unit 7 can be rotated about the long axis of the rotating unit 7 as the rotation axis.

A graphite crucible made of graphite and capable of supplying carbon to the starting material solution 5 is preferred as the crucible 3, but a crucible other than a graphite crucible can be used herein so long as a hydrocarbon gas and a solid carbon source can be added to the crucible. In order to render uniform the composition of the starting material solution 5, it is, preferable to rotate the crucible 3 as well while periodically inverting the rotation direction to a positive direction and reverse direction.

The starting material solution 5 is heated for instance by a heater 4 of induction heating type provided around the crucible 3, to be kept in a molten state. The temperature inside the crucible 3 lies in the range of 1700° C. to 2100° C., for instance of 1800° C. to 2050° C., and preferably for instance of 1850° C. to 2000° C.

The starting material solution 5 is not particularly limited, so long as the solution contains silicon and carbon that are used for growing a crystal of silicon carbide, but it is preferable to use a solution in which carbon is dissolved in a Si solvent (silicon alloy) having an additive element added thereto. As the silicon alloy, an alloy of silicon and at least one additive element selected from among Ti, Cr, Sc, Ni, Al, Co, Mn, Mg, Ge, As, P, N, O, B, Dy, Y, Nb, Nd and Fe can be used. Among the foregoing, an alloy having silicon and at least one additive element selected from among Cr, Ti and Al is preferred herein. In particular, Cr is preferred in that it exhibits high carbon solubility, low vapor pressure and is chemically stable. In particular, a Si—Cr alloy system containing Cr in a proportion ranging from 20 mol % to 60 mol % with respect to 100 mol % as the total of Si and Cr is preferably used as the solvent.

Silicon or a silicon alloy of silicon and the above-described additive elements can be used herein as the silicon source of the starting material solution. As the carbon source of the starting material solution, for instance, graphite, glassy carbon, SiC, or a hydrocarbon gas such as methane, ethane, propane or acetylene can be used.

Figure 2:
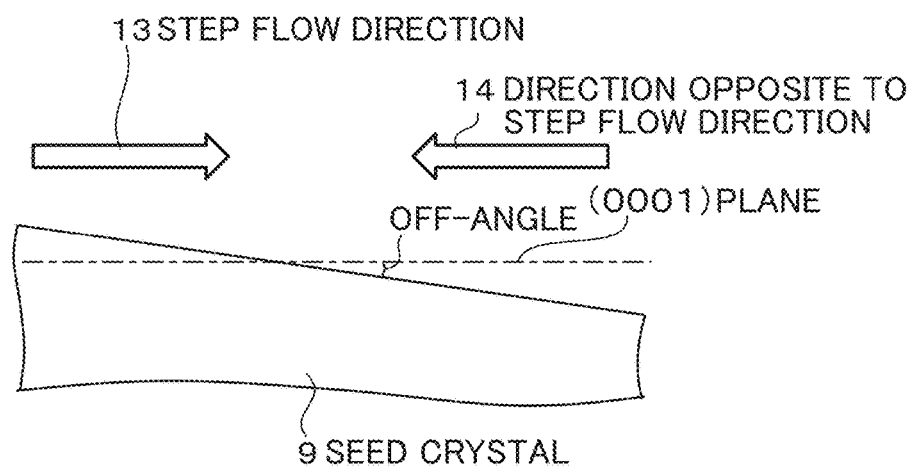
FIG. 2 is a schematic diagram of the surface of a seed crystal 9 having an off-angle.

A crystal polymorph typified by 4H—SiC and 6H—SiC can be used as the seed crystal 9. FIG. 2 is a schematic diagram of the surface of the seed crystal 9. The seed crystal 9 is formed through oblique cutting in a range of 0.5 degrees to 4 degrees, preferably 0.5 degrees to 2 degrees, with respect to the (0001) plane. The angle between the surface of the seed crystal 9 and the (0001) plane is referred to as an off-angle. The step flow direction is the direction of advance of the off-angle. For instance, if the off-angle is formed in the [11-20] direction, then the step flow direction is the [11-20] direction. As described below, the occurrence of trenches during crystal growth can be suppressed by causing the starting material solution 5 to flow in a direction 14 opposite to the step flow direction.

At least the starting material solution 5 in contact with the crystal growth surface of the seed crystal 9 must be in a supersaturated state. Examples of methods for obtaining a supersaturated state in SiC include for instance an evaporation method that involves bringing about a supersaturated state through evaporation of a solution, a cooling method that involves immersing a seed crystal substrate in a SiC solution at a saturated concentration, followed by supercooling to bring about a supersaturated state, and a temperature difference method that involves immersing a seed crystal substrate in a SiC solution having a temperature gradient, to crystallize a SiC crystal at a low-temperature portion.

When a temperature difference method is resorted to, the rotating unit 7 is pulled up, while being rotated, up to a position at which the seed crystal 9 is brought into grazing contact with the liquid surface of the starting material solution 5, i.e. to a position within a range of up to ±3 mm of the distance between the liquid surface and the crystal growth surface of the seed crystal 9, in order to bring into a supersaturated state only the vicinity of the seed crystal 9, for example a region spaced from the seed crystal 9 by a distance equal to or smaller than the radius of the seed crystal 9, for instance through control of heating by the heater 4, or through cooling by the seed crystal 9. As a result, a crystal of SiC precipitates on the crystal growth surface of the seed crystal 9. In particular, a single crystal of SiC precipitates. When rotating the seed crystal 9 at a position spaced from the liquid surface, it suffices to bring the seed crystal 9 into contact with the liquid surface before rotation; as a result the seed crystal 9 and the starting material solution 5 remain thereafter in contact on account of surface tension, even when the seed crystal 9 is moved off by about 3 mm from the liquid surface.

In a case where a cooling method or an evaporation method is resorted to, the starting material solution 5 as well becomes supersaturated, and accordingly crystal growth can be accomplished by rotating the rotating unit 7 in a state where the seed crystal 9 is immersed inside the starting material solution 5.

The maximum rotational speed of the seed crystal 9 lies preferably in the range of 50 rpm to 300 rpm, more preferably 50 rpm to 200 rpm, and yet more preferably 100 rpm to 150 rpm. The growth rate can be increased provided that the maximum rotational speed is not too low. Further, the growth rate can be increased without putting strain on the device so long as the maximum rotational speed is not too high.

The rotation of the seed crystal 9 is preferably rotation such that forward rotation and reverse rotation are repeated periodically. The rotation period lies in the range of 10 seconds to 5 minutes, preferably 15 seconds to 3 minutes, and more preferably about 30 seconds to about 2 minutes and 30 seconds. The flow of the starting material solution at the growth surface of the seed crystal during crystal growth can be controlled by periodically switching the rotation direction. Explained in concrete terms, the flow of the starting material solution, averaged over the period during which crystal growth is carried out, is made into flow radiating linearly outward from the center of rotation, through periodic switching of the rotation direction; it becomes thus possible to widen the region in which the starting material solution flows against the step flow direction.

The occurrence of trenches in the seed crystal 9 having an off-angle can be suppressed by causing the starting material solution 5 to flow in the direction 14 opposite to the step flow direction as illustrated in FIG. 2. In order to widen in the present embodiment the region in which flow opposing the step flow direction is possible, the rotation center 15 of the seed crystal 9 is positioned spaced from the center 11 of the seed crystal, downstream in the step flow direction 13, as illustrated in FIGS. 3(*a*) to 3(*c*).

Preferably, the rotation center 15 is spaced from the center 11 of the seed crystal by 15% or more, for instance 20% or more and for instance 23% or more, of the diameter of the seed crystal. The term diameter of the seed crystal denotes herein the maximum diameter of the seed crystal. In a case where the shape of the seed crystal is hexagonal, the diameter of the seed crystal is the length of the longest diagonal. A region that allows suppressing occurrence of trenches can be made larger provided that the rotation center 15 and the center 11 of the seed crystal are not too close to each other.

Figure 3A:
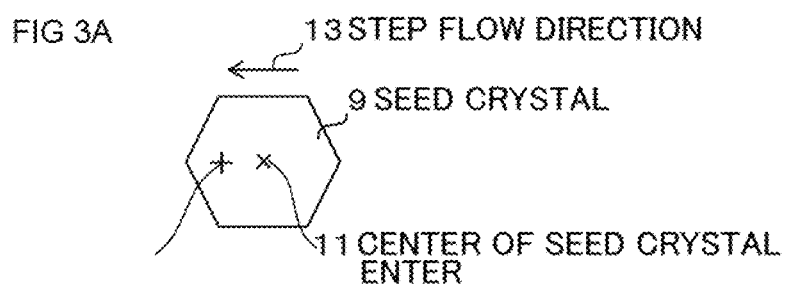
FIGS. 3A to 3C are diagrams illustrating the positional relationship between the center 11 of a seed crystal and a rotation center 15 in the present embodiment.
Figure 3B:
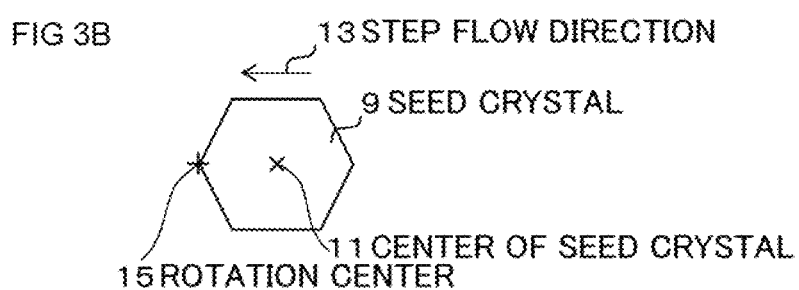
Figure 3C:
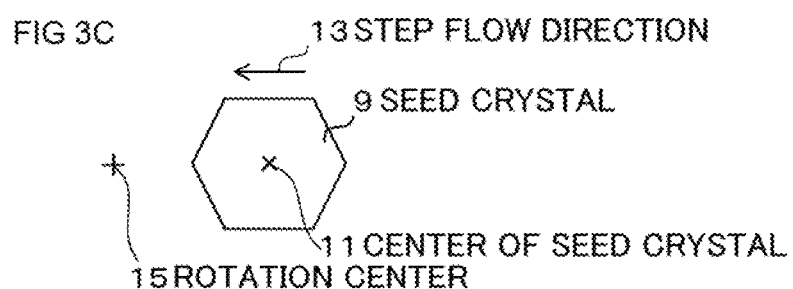

FIGS. 3(*a*) to 3(*c*) are diagrams illustrating the positional relationship between the center 11 of the seed crystal and rotation center 15 in the present embodiment. In FIG. 3(*a*), the rotation center 15 lies within the seed crystal 9. In FIG. 3(*b*), the rotation center 15 is further spaced from the center 11 of the seed crystal, and lies at the end of the seed crystal 9. In FIG. 3(*c*), the rotation center 15 is further spaced from the center 11 of the seed crystal, and lies herein outside the seed crystal 9. The farther the center 11 of the seed crystal and the rotation center 15 are spaced from each other, the more uniform becomes the flow of the starting material solution 5 in the plane of the seed crystal 9, and the smoother becomes the crystal within the entire plane of the seed crystal 9.

The angle formed by the direction from the rotation center 15 towards the center 11 of the seed crystal and the step flow direction 13 is preferably 180 degrees±45 degrees, more preferably 180 degrees±15 degrees and particularly preferably 180 degrees±5 degrees. That is because within these ranges, the region in which the flow of the starting material solution 5 runs against the step flow direction 13 widens in the crystal growth surface of the seed crystal 9, and thus a region in which few trenches occur widens as well in the resulting crystal.

Flow of the starting material solution 5 against the step flow direction 13, on the crystal growth surface of the seed crystal 9, can be created through rotation of the crucible 3, without necessarily rotating the seed crystal 9. Specifically, the crucible 3 is rotated in such a manner that the position at the rotation center of the crucible 3 lies downstream, in the step flow direction 13, with respect to the central position of the seed crystal 9, and also in such a manner that the rotation of the crucible is swapped periodically between forward rotation and reverse rotation. During rotation of the crucible 3, the seed crystal 9 may be rotated or not. Rotation of the seed crystal 9 may be accomplished eccentrically and with periodic reversal, as described above.

By rotating the crucible 3 so that the forward rotation and reverse rotation are swapped periodically it becomes thus possible to turn the flow of starting material solution, averaged over the period during which crystal growth is carried out, into outward flow from the rotation center of the crucible 3. To that end, the position of the rotation center of the crucible 3 is set to lie downstream, in the step flow direction, with respect to the central position of the seed crystal 9, whereupon the averaged flow of starting material solution 5 opposes the step flow direction 13.

The rotation center of the crucible 3 may lie within outside the seed crystal 9. The maximum rotational speed of the crucible 3 is preferably in the range of 5 rpm to 30 rpm, more preferably 5 rpm to 20 rpm. The growth rate can be increased provided that the maximum rotational speed is not too low. The growth rate can be increased without putting strain on the device so long as the maximum rotational speed is not too high.

It suffices herein that the direction of the rotation of the crucible 3 and/or the seed crystal 9 be periodically reversed. The maximum rotational speed may be maintained or not during a predetermined time. The acceleration during switching between forward rotation and reverse rotation can be set as appropriate within a range such that the load of the device is not excessive. For instance, switching from forward rotation at maximum rotational speed to reverse rotation at maximum rotational speed may take 1 second to 120 seconds, preferably 3 seconds to 60 seconds, and more preferably 5 seconds to 30 seconds.

In the present embodiment, a crystal of silicon carbide having few trenches and little surface roughening can be obtained by virtue of the simple improvement of moving the rotation center of the seed crystal, or of the crucible, from the center of the seed crystal.

EXAMPLES

Example 1

Herein a 4H—SiC seed crystal C plane (1-degree off-substrate) having an 1-inch diameter was immersed in a Si—Cr solvent (Si:Cr=60:40 (molar ratio)) at 1900° C. inside a graphite crucible that rotated at a maximum rotational speed of 20 rpm while switching between forward rotation and reverse rotation at 30-second periods, specifically in such a manner that forward rotation at maximum rotational speed for 10 seconds was switched to reverse rotation at maximum rotational speed, and that maximum rotational speed was maintained for 20 seconds; the seed crystal was grown for 3 hours through by rotating the seed crystal at a maximum rotational speed of 150 rpm while switching between forward rotation and reverse rotation at 2-minute periods, specifically in such a manner that the forward rotation at maximum rotational speed for 20 seconds was switched to reverse rotation at maximum rotational speed, and that maximum rotational speed was maintained for 100 seconds. The carbon necessary for growing the SiC crystal was supplied from the graphite crucible to the Si—Cr solvent. In Example 1, a supersaturated state is obtained in accordance with a temperature difference method. Heat is dissipated from the seed crystal via a holder. The rotation center position of the seed crystal was set to a point spaced by 2.5 cm from the central position of the seed crystal. The direction of the rotation center of the seed crystal viewed from the seed crystal center was set to be identical to the step flow direction, i.e. was set so that the angle formed between the step flow direction and the direction from the rotation center towards the center of the seed crystal was 180 degrees.

Figure 5:
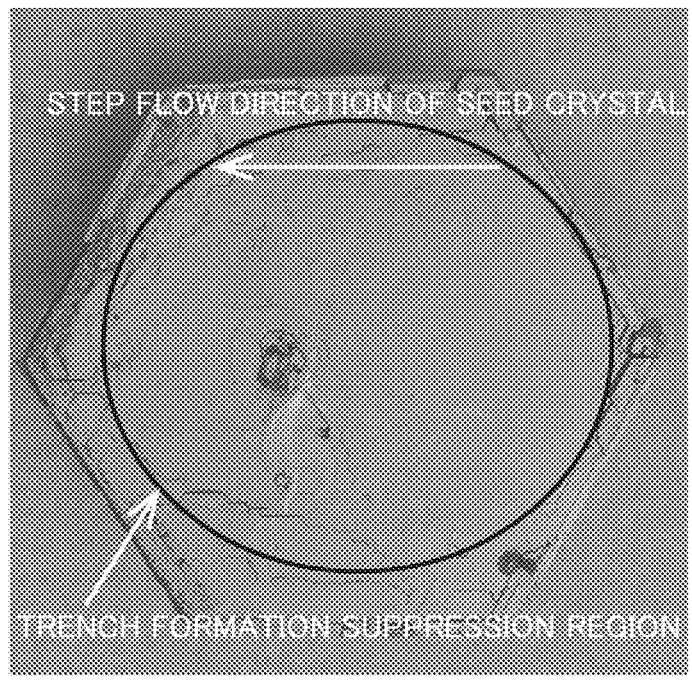
FIG. 5 is a photograph of the growth surface of a silicon carbide single crystal obtained in Example 1.

An observation of the morphology of the growth surface of the obtained single crystal revealed that formation of trenches on the growth surface was suppressed substantially over the entire surface, as illustrated in FIG. 5. Regarding this result, it is deemed that formation of trenches over the entire surface of the obtained single crystal was suppressed by virtue of the fact that, on account of rotation in Example 1, the starting material solution 5 flowed against the step flow direction over substantially the entire growth surface of the seed crystal. The black spot at the central portion of the single crystal obtained in FIG. 5 is a particle mixed in during crystal growth and that arises from causes different from those of trenches or surface roughening during crystal growth, which are the problem of the present invention.

Example 2

Crystal growth was performed in the same way as in Example 1, but herein the rotation center position of the seed crystal was set to a point spaced by 0.6 cm from the central position of the seed crystal, and the direction of the rotation center of the seed crystal as viewed from the seed crystal center was set to be identical to the step flow direction.

Figure 6:
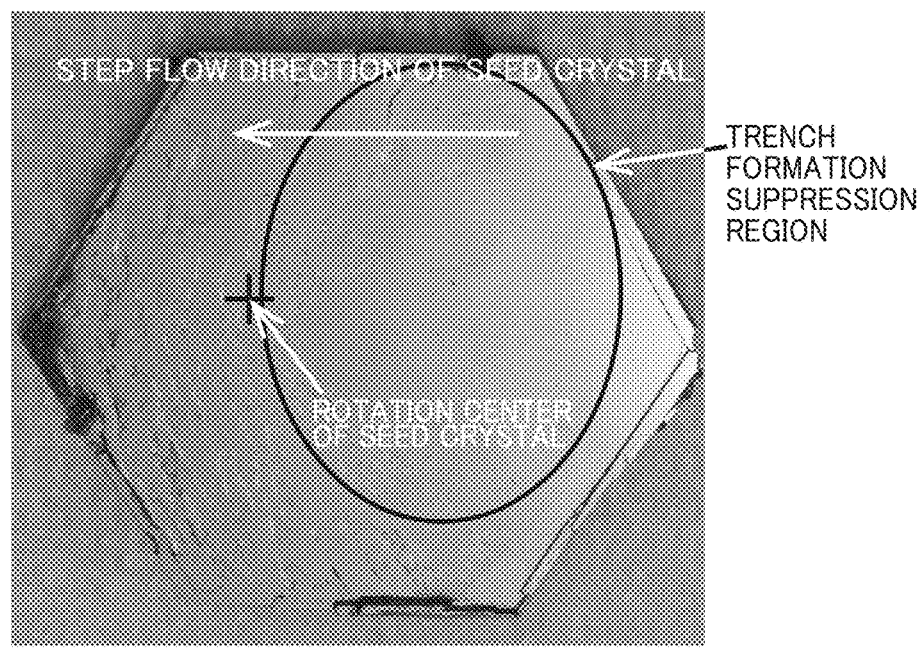
FIG. 6 is a photograph of the growth surface of a silicon carbide single crystal obtained in Example 2.

The observation results of the morphology of the growth surface revealed that formation of trenches could be suppressed in a region further upstream, on the step flow side, than the rotation center of the seed crystal, as illustrated in FIG. 6.

Comparative Example 1

Crystal growth was carried out in the same way as in Example 1, but herein the rotation center position of the seed crystal was set to the central position of the seed crystal.

Figure 7:
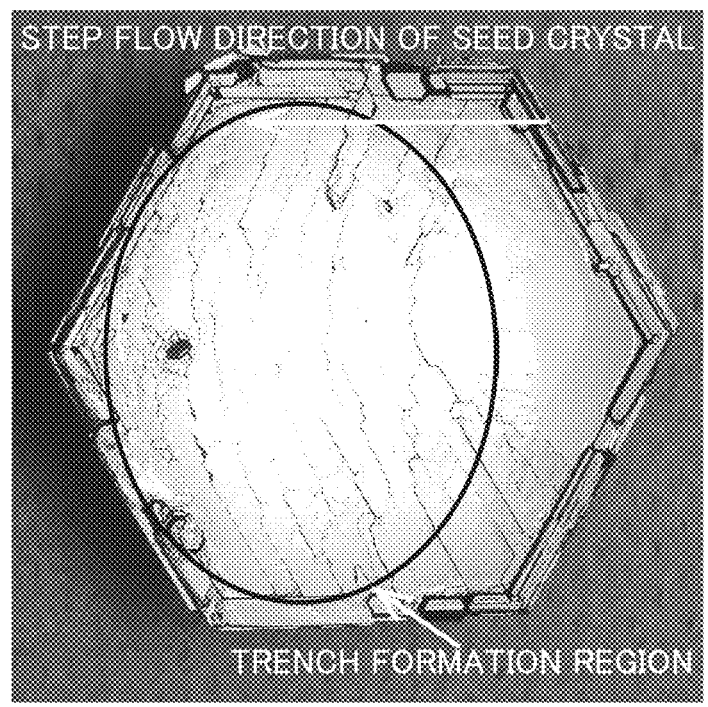
FIG. 7 is a photograph of the growth surface of a silicon carbide single crystal obtained in Comparative example 1.

The observation results of the morphology of the growth surface revealed that although there was a region in which formation of trenches was slightly suppressed, on the right in the figure, trenches formed nevertheless over substantially the entire area of the seed crystal, as illustrated in FIG. 7.

Figure 10A:
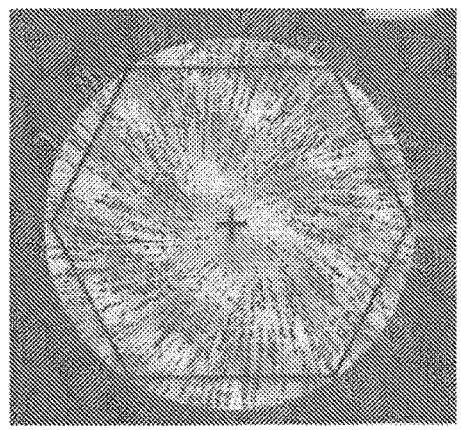
FIGS. 10A and 10B are results worked out through numerical value calculation of the average value of flow of a starting material solution occurring 0.2 mm below the growth surface of a seed crystal, in Comparative example 1 and Example 2.
Figure 10B:
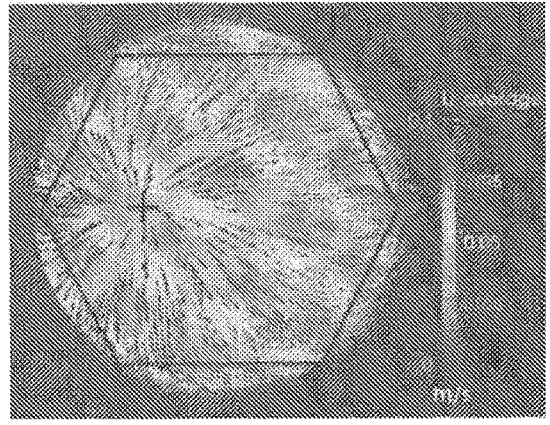

A three-dimensional numerical calculation simulation was performed in order to evaluate the influence exerted by the flow of starting material solution on the surface shape. FIGS. 10(a) and 10(b) illustrate results, worked out through numerical value calculation, of the average value of flow of starting material solution occurring 0.2 mm below the growth surface of the seed crystal in Comparative example 1 and Example 2. In FIG. 10(a), the position of the rotation center and the position of the center of the seed crystal are identical, and accordingly there arises outward flow, centered at the rotation center (position denoted by "+" in FIG. 10). A region in which the flow runs in a direction (rightward direction in the figure) opposing the step flow direction is slightly formed rightward of the rotation center in FIG. 10(a). This region matches the region in which formation of trenches is suppressed of FIG. 7.

By contrast, the rotation center in FIG. 10(b) is offset leftward in the figure from the central position of the seed crystal, and accordingly a region in which the flow runs in a direction opposing the step flow direction forms rightward in the seed crystal. This region matches the region in which formation of trenches is suppressed in FIG. 6. A comparison between FIGS. 10(a) and 10(b) reveals that the region in which the flow of the starting material solution runs against the step flow direction becomes wider, and thus the region in which formation of trenches is suppressed becomes wider, through shifting of the rotation center downstream in the step flow direction.

Comparative Example 2

Crystal growth was performed in the same way as in Example 1, but herein the rotation center position of the seed crystal was set to a point spaced by 0.6 cm from the central position of the seed crystal, and the direction of the rotation center of the seed crystal when viewed from the seed crystal center was set to a direction opposite to the step flow direction.

Figure 8:
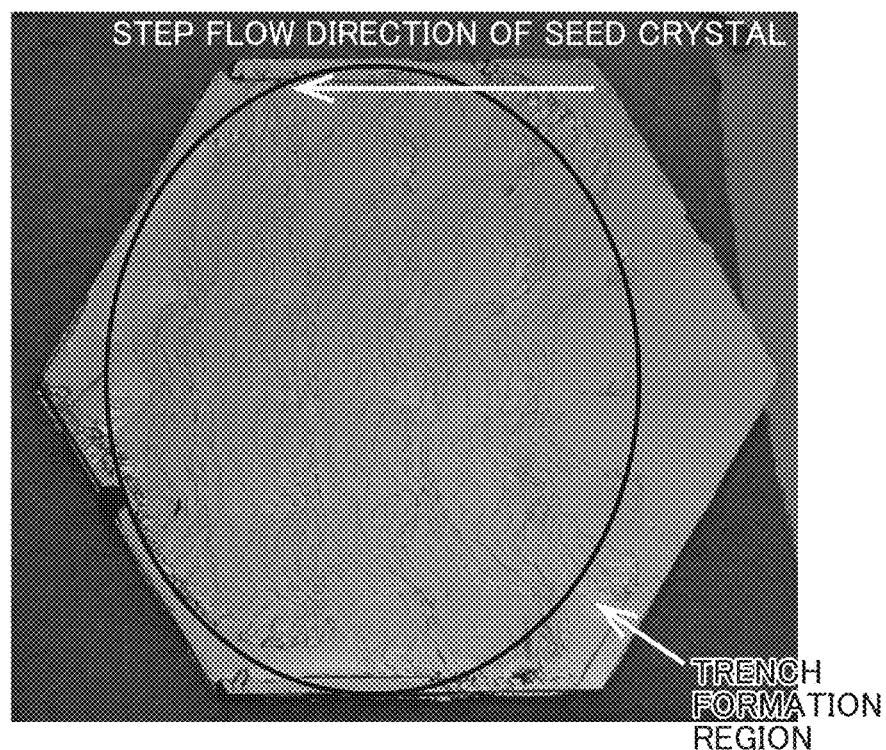
FIG. 8 is a photograph of the growth surface of a silicon carbide single crystal obtained in Comparative example 2.

Observation results of the morphology of the growth surface revealed that trenches formed over substantially the entire area of the seed crystal, as illustrated in FIG. 8. That is because shifting of the rotation center of the seed crystal upstream in the step flow direction resulted in shrinking of the region in which the flow of starting material solution ran in a direction opposite to the step flow direction, and there was thus virtually no region in which formation of trenches was suppressed.

Comparative Example 3

Herein a 4H—SiC seed crystal C plane (1-degree off-substrate) having a 1-inch diameter was immersed in a Si—Cr solvent (Si:Cr=60:40 (molar ratio)) at 1900° C. inside a graphite crucible that rotated at 20 rpm, and growth was conducted for 3 hours while rotating the seed crystal at a rotational speed of 150 rpm (in a direction opposite to the rotation direction of the crucible.). The rotation center position of the seed crystal was set to the central position of the seed crystal.

Figure 9:
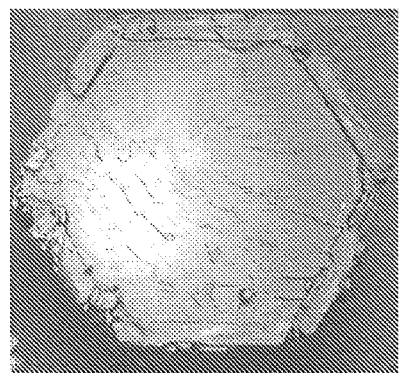
FIG. 9 is a photograph of the growth surface of a silicon carbide single crystal obtained in Comparative example 3.

Observation results of the morphology of the growth surface revealed that trenches formed over substantially the entire area of the seed crystal, as illustrated in FIG. 9.

FIGS. 4(a) to 4(e) illustrate the positional relationship between the rotation center and the center of the seed crystal in Examples 1 and 2 and Comparative examples 1 to 3. Experimental conditions and results are summarized in Table 1. In Table 1, step flow is abbreviated as SF. In Examples 1 and 2, there was obtained a region having a smooth surface and in which occurrence of trenches was suppressed within the seed crystal.

TABLE 1

| | Rotation center position | Type of rotation | Result |
| --- | --- | --- | --- |
| Example 1 | SF downstream 2.5 cm | Periodic inversion of forward-reverse | Trench suppression over entire surface |
| Example 2 | SF downstream 0.6 cm | Periodic inversion of forward-reverse | Trench suppression in region on SF upstream side |
| Comparative example 1 | Coincides with seed crystal center | Periodic inversion of forward-reverse | Formation of trenches over substantially entire area |
| Comparative example 2 | SF downstream 0.6 cm | Periodic inversion of forward-reverse | Formation of trenches over substantially entire area |
| Comparative example 3 | Coincides with seed crystal center | Normal rotation | Formation of trenches over substantially entire area |

REFERENCE SIGNS LIST

1 Single crystal growth device
3 Crucible
4 Heater
5 Starting material solution
7 Rotating unit
9 Seed crystal
11 Center of seed crystal
13 Step flow direction
14 Direction opposite to the step flow direction
15 Rotation center

The invention claimed is:

1. A method for producing a crystal of silicon carbide, the method comprising rotating a seed crystal of silicon carbide while bringing the seed crystal into contact with a starting material solution containing silicon and carbon,
wherein a crystal growth surface of the seed crystal has an off-angle,
the position of a rotation center of the seed crystal lies downstream of the central position of the seed crystal in a step flow direction that is a formation direction of the off-angle, and
rotation of the seed crystal includes periodic repeating of forward rotation and reverse rotation.

2. The method for producing a crystal of silicon carbide according to claim 1, wherein the rotation center of the seed crystal is present within the seed crystal.

3. The method for producing a crystal of silicon carbide according to claim 1, wherein the rotation center of the seed crystal is present outside the seed crystal.

4. The method for producing a crystal of silicon carbide according to claim 1, wherein rotation of the seed crystal is carried out within a plane parallel to a liquid surface of the starting material solution.

5. The method for producing a crystal of silicon carbide according to claim 1, wherein the starting material solution contains chromium, and the proportion of chromium is 20 mol % to 60 mol % with respect to 100 mol % as the total of silicon and chromium.

6. A method for producing a crystal of silicon carbide, the method comprising bringing a seed crystal of silicon carbide into contact with a starting material solution containing silicon and carbon and held within a vessel,
wherein a crystal growth surface of the seed crystal has an off-angle,
the vessel rotates in such a manner that the position of a rotation center thereof lies downstream of the central position of the seed crystal in a step flow direction that is a formation direction of the off-angle, and
rotation of the vessel includes periodic repeating of forward rotation and reverse rotation.

7. The method for producing a crystal of silicon carbide according to claim 6, wherein the rotation center of the vessel is present within the seed crystal.

8. The method for producing a crystal of silicon carbide according to claim 6, wherein the rotation center of the vessel is present outside the seed crystal.

9. The method for producing a crystal of silicon carbide according to claim 6, wherein the starting material solution contains chromium, and the proportion of chromium is 20 mol % to 60 mol % with respect to 100 mol % as the total of silicon and chromium.

* * * * *